United States Patent [19]

Yamazaki

[11] 4,398,343
[45] Aug. 16, 1983

[54] METHOD OF MAKING SEMI-AMORPHOUS SEMICONDUCTOR DEVICE

[76] Inventor: Shunpei Yamazaki, 21-21 Kitakarasuyama 2-chome, Setagaya-Ku, Tokyo, Japan

[21] Appl. No.: 265,841

[22] Filed: May 21, 1981

[30] Foreign Application Priority Data

May 26, 1980 [JP] Japan ................................. 55-69772

[51] Int. Cl.³ ................... H01L 21/324; H01L 21/326
[52] U.S. Cl. ...................................... 29/585; 29/572; 29/576 T; 29/584; 148/1.5; 357/2; 427/86; 136/258
[58] Field of Search ...................... 29/576 T, 584, 585, 29/586, 572; 148/1.5; 357/2, 4, 59 A; 427/86; 136/258 AM

[56] References Cited

U.S. PATENT DOCUMENTS

| | | | |
|---|---|---|---|
| 3,795,977 | 3/1974 | Berkenblit et al. | 29/585 |
| 4,151,058 | 4/1979 | Kaplan et al. | 204/192 S |
| 4,174,521 | 11/1979 | Neale | 29/584 X |
| 4,196,438 | 4/1980 | Carlson | 357/2 X |
| 4,199,692 | 4/1980 | Neale | 357/2 X |
| 4,226,898 | 10/1980 | Ovshinsky et al. | 427/86 X |

OTHER PUBLICATIONS

Jang, J. et al, "Hydrogenation and Doping of Vacuum Evaporated a-Si", *Journal of Non-Crystalline Solids*, vol. 35 & 36, (1980), pp. 313-318.

*Primary Examiner*—L. Dewayne Rutledge
*Assistant Examiner*—Alan E. Schiavelli
*Attorney, Agent, or Firm*—Gerald J. Ferguson, Jr.; Joseph J. Baker

[57] ABSTRACT

A semi-amorphous semiconductor device manufacturing method in which a non-single crystal semiconductor layer is provided on a substrate to form therebetween a PN, PIN, PI or NI junction and a current is applied to the non-single crystal semiconductor layer to provide a semi-amorphous semiconductor layer. When the current is applied to the non-single crystal semiconductor layer, it is irradiated by light and/or heated at the same time.

33 Claims, 53 Drawing Figures

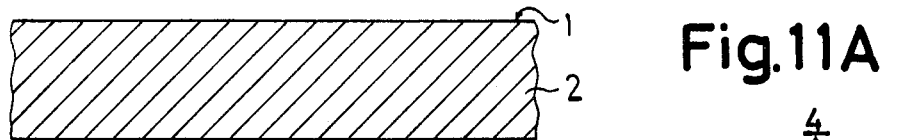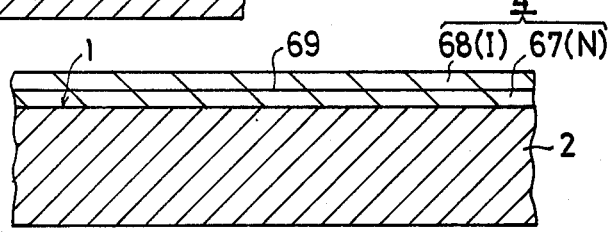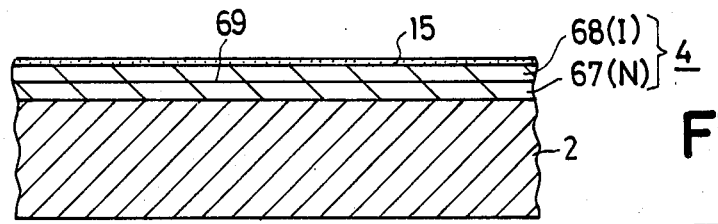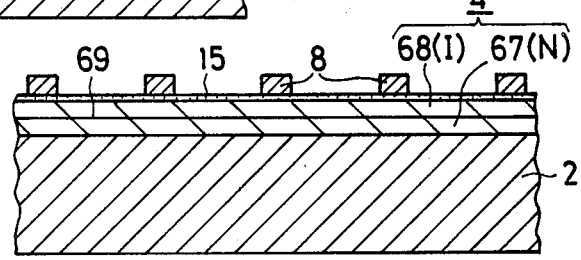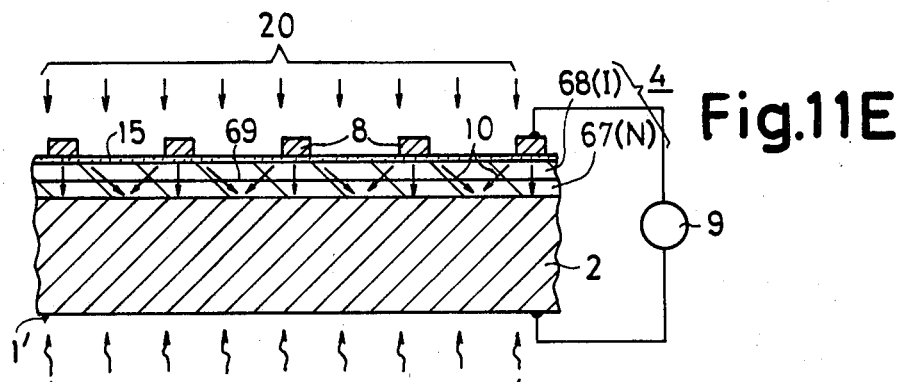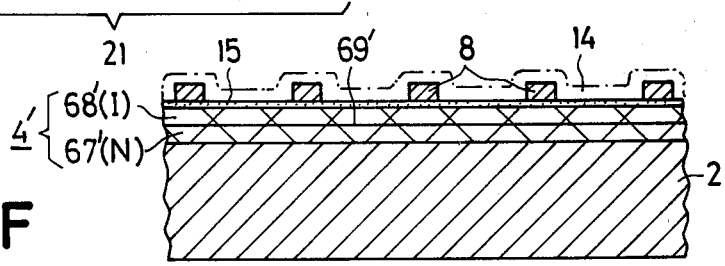

METHOD OF MAKING SEMI-AMORPHOUS SEMICONDUCTOR DEVICE

BACKGROUND OF THE INVENTION

1. Field of the Invention

The present invention relates to a method for the manufacture of a semiconductor device through the use of a semi-amorphous semiconductor.

The semi-amorphous semiconductor herein mentioned is defined as a semiconductor which is formed of a mixture of a microcrystalline semiconductor and a non-crystalline semiconductor and in which the mixture doped with a dangling bond neutralizer and the microcrystalline semiconductor has a lattice strain.

2. Description of the Prior Art

In a semiconductor device using the semi-amorphous semiconductor, the semi-amorphous semiconductor formed in the shape of a layer provides a large optical absorption coefficient as compared with a single crystal semiconductor. Accordingly, with a semi-amorphous semiconductor layer of sufficiently smaller thickness than the layer-shaped single crystal semiconductor of the semiconductor device using the single crystal semiconductor, it is possible to achieve a higher photoelectric conversion efficiency than that obtainable with the single crystal semiconductor device.

Further, in the semi-amorphous semiconductor device, the semi-amorphous semiconductor provides a high degree of photoconductivity, a high degree of dark-conductivity, a high impurity ionization rate and a large diffusion length of minority carriers as compared with an amorphous or polycrystalline semiconductor. This means that the semi-amorphous semiconductor device achieves a higher degree of photoelectric conversion efficiency than an amorphous or polycrystalline semiconductor device.

Accordingly, the semi-amorphous semiconductor device is preferable as a semiconductor photoelectric conversion device.

For the manufacture of the semi-amorphous semiconductor device, there has heretofore been proposed a method including a step of forming the semi-amorphous semiconductor in the shape of a layer or a substrate by the glow discharge method or plasma CVD method employing a gas of hydride of a semiconductor material, such as silane ($SiH_4$) gas, a gas of halide of a semiconductor material, such as silicon tetrafluoride ($SiF_4$) gas, and a gas of hydride and halide of a semiconductor material, such as dichlorosilane ($SiH_2Cl_2$).

With such a conventional method, the semi-amorphous semiconductor forming the semi-amorphous semiconductor device can be formed containing hydrogen and/or halogen as a dangling bond neutralizer. Accordingly, as compared with the case of containing no hydrogen and/or halogen, the semi-amorphous semiconductor can be obtained containing an extremely small number of dangling bonds which serve as minority carrier recombination centers; namely, the semi-amorphous semiconductor can be obtained containing a markedly small number of recombination centers.

With the abovesaid prior art manufacturing method, however, the number of recombination centers contained in the semi-amorphous semiconductor is as large as about $10^{17}$ to $10^{19}/cm^3$.

Further, in a semiconductor photoelectric conversion device, it is desirable, in general, that the diffusion length of the minority carriers of the semiconductor be approximately 1 to 50 μm which is intermediate between 300 Å which is the diffusion length of the minority carriers of an amorphous semiconductor and $10^3$ μm which is the diffusion length of the minority carriers of a single crystal semiconductor.

With the abovesaid conventional manufacturing method, however, since the semi-amorphous semiconductor is formed containing as large a number of recombination centers as about $10^{17}$ to $10^{19}/cm^3$, the diffusion length of the minority carriers of the semi-amorphous semiconductor cannot be set to the abovementioned desirable value of about 1 to 50 μm.

Therefore, according to the prior art manufacturing method, the semi-amorphous semiconductor can be obtained to have a photoelectric conversion efficiency as low as only about 2 to 4%.

SUMMARY OF THE INVENTION

Accordingly, it is an object of the present invention to provide a novel semi-amorphous semiconductor device manufacturing method which permits the fabrication of a semi-amorphous semiconductor device with far higher photoelectric conversion efficiency than that of the semi-amorphous semiconductor device produced by the conventional manufacturing method.

The manufacturing method of the present invention comprises the steps of preparing a substrate, forming thereon in the shape of a layer a non-single crystal semiconductor doped with a dangling bond neutrallizer, providing a conductive layer on the non-single crystal semiconductor, and applying a current and light and/or heat to the non-single crystal semiconductor through the conductive layer to form a semi-amorphous semiconductor in the effective current pass region. The non-single crystal semiconductor herein mentioned indicates a semi-amorphous semiconductor, an amorphous semiconductor or a mixture thereof. It must be noted here that, in the case where the non-single crystal semiconductor is a semi-amorphous semiconductor, this semi-amorphous semiconductor and the semi-amorphous semiconductor which is formed in the effective current pass region differs in terms of structure in that the latter contains a larger quantity of microcrystalline semiconductor than does the former.

The mechanism of the formation of the semi-amorphous semiconductor in the effective current pass region by applying a current and light and/or heat to the non-single crystal semiconductor is that heat is generated by the current in the effective current pass region to transform the non-single crystal semiconductor in that region by the thermal energy to contain a large quantity of microcrystalline semiconductor.

Such thermal energy acts to confine dangling bonds of the semiconductor in the effective current pass region and in its vicinity, thus neutralizing the dangling bonds of the semiconductor there. Further, the non-single crystal semiconductor is formed to be doped with the dangling bond neutralizer. Accordingly, the above-said thermal energy serves to activate the dangling bond neutralizer in the effective current pass region and in its vicinity to combine it with the dangling bonds of the semiconductor. As a result of this, the semi-amorphous semiconductor formed in the effective current pass region has the minority carrier recombination centers but its number can be decreased as small as about $1/10^2$ to $1/10^4$ that of the semi-amorphous semi-conductor obtainable with the conventional manufacturing method. And this makes it possible to obtain the semi-amorphous semiconductor with the diffusion length of the minority carriers held in the aforementioned desirable range of 1 to 50 μm.

Accordingly, it is possible with the manufacturing method of the present invention to produce a semi-amorphous semiconductor device which has a far higher photoelectric conversion efficiency of 8 to 12% than that of the semi-amorphous semiconductor device fabricated by the conventional method.

Further, according to the manufacturing method of the present invention, the semi-amorphous semiconductor in the abovesaid effective current pass region can be obtained as a semiconductor which has an interatomic distance close to that in the single crystal semiconductor.

Accordingly, the manufacturing method of the present invention is capable of fabricating a semi-amorphous semiconductor device which is highly stable in operation as compared with the semi-amorphous semiconductor device produced by the prior art method.

Other objects, features and advantages of the present invention will become more apparent from the following description taken in conjunction with the accompanying drawings.

BRIEF DESCRIPTION OF THE DRAWINGS

FIGS. 11A to 11F, 12A to 12E, 13A to 13F, 14A to 14E and 15A to 15E respectively illustrate other embodiments of the manufacturing methods of the present invention.

DESCRIPTION OF THE PREFERRED EMBODIMENTS

FIGS. 1A to 1F illustrate a sequence of steps involved in the manufacture of a semi-amorphous semiconductor device in accordance with a embodiment of the present invention.

Figure 1A:
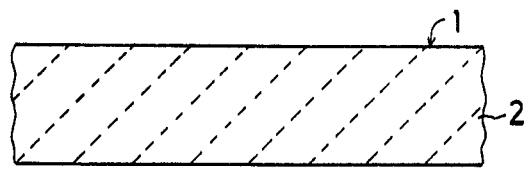
FIGS. 1A to 1F schematically shows, in section, a sequence of steps involved in the manufacture of a semi-amorphous semiconductor device in accordance with an embodiment of the present invention.

The manufacture starts with the preparation of a substrate 2 having a flat major surface 1, such as shown in FIG. 1A. In this embodiment, the substrate 2 is made of an insulator such as ceramics.

Figure 1B:
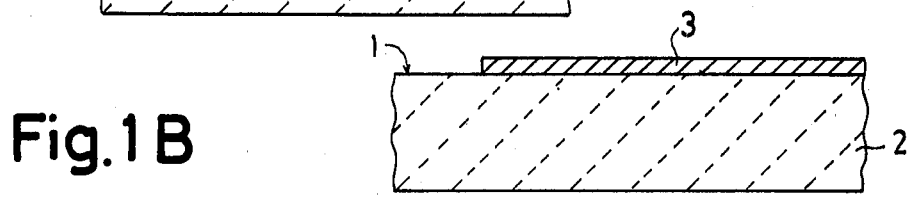

The next step consists in the formation of a conductive layer 3 on the major surface 1 of the substrate 2 by a known method, as depicted in FIG. 1B. The conductive layer 3 is made of metal in this example and has a desired pattern on the major surface 1 of the substrate 2.

Figure 1C:
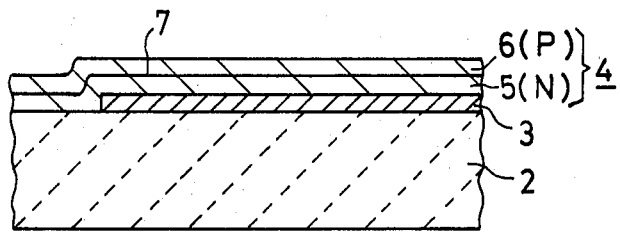

Then, a non-single crystal semiconductor 4 doped with a dangling bond neutralizer is formed in layer on the major surface 1 of the substrate 2 to cover the conductive layer 3, as depicted in FIG. 1C.

The non-single crystal semiconductor 4 can be formed of non-single crystal silicon, germanium or additional semiconductor material compound expressed by $Si_3N_{4-x}$ ($0<x<4$), $SiO_{2-x}$ ($0<x<2$), $SiC_x$ ($0<x<1$) or $Si_xGe_{1-x}$ ($0<x<1$). Also it can be formed of III-V Group compound semiconductors such as GaAs, BP, InP or the like. The dangling bond neutralizer is composed of hydrogen or halogen such as fluoride or chlorine. The non-single crystal semiconductor 4 has a two-layer structure comprising an N type non-single crystal semiconductor layer 5 and a P type non-single crystal semiconductor layer 6, and hence it provides one PN junction 7.

The non-single crystal semiconductor 4 means a semi-amorphous semiconductor, an amorphous semiconductor or a mixture thereof and it is desired to be the semi-amorphous semiconductor. The semi-amorphous semiconductor is formed of a mixture of a microcrystalline semiconductor and a non-crystalline semiconductor and the mixture is doped with a dangling bond neutralizer and the microcrystalline semiconductor has a lattice strain. According to an embodiment of the semi-amorphous semiconductor, the microcrystalline semiconductor and the non-crystalline semiconductor are both, for example, silicon; in this case, the mixture is normally silicon and the microcrystalline semiconductor is dispersed in the non-crystalline semiconductor. In the case where the non-single crystal semiconductor 4 is the abovesaid semi-amorphous semiconductor, it can be formed by the method described hereinbelow.

Figure 2:
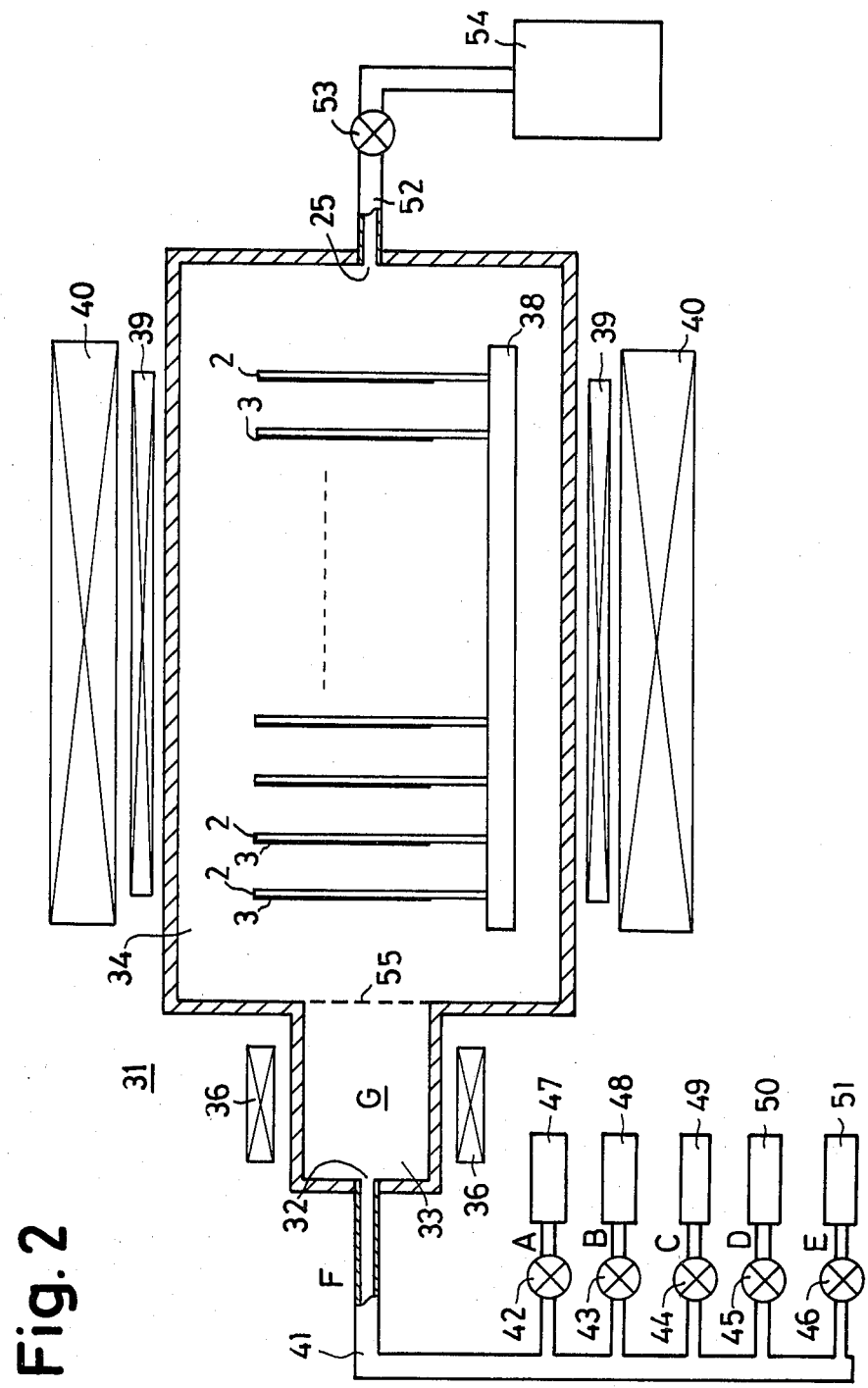
FIG. 2 is a schematic diagram illustrating an arrangement for the formation of a non-single crystal semiconductor in the step of FIG. 1C.

FIG. 2 illustrates an embodiment of the non-single crystalline semiconductor manufacturing method of the present invention and an arrangement therefor, in which a reaction chamber 31 is employed.

The reaction chamber 31 has a gas inlet 32, a gas ionizing region 33, semiconductor depositing region 34, and a gas outlet 25 which are provided in this order. The gas ionizing region 33 has a smaller effective cross-section than the semiconductor depositing region 34. Arranged around the gas ionizing region 33 is an ionizing high-frequency power source 36 which applies to the gas ionizing region 33 an ionizing high-frequency electromagnetic field of, for example, as 1 to 10 GHz, preferably 2.46 GHz. The high-frequency power source 36 may be formed by a coil which is supplied with a high-frequency current.

Disposed around the semiconductor depositing region 34 of the reaction chamber 31 is an orientating-accelerating high-frequency power source 39 which applies to the semiconductor depositing region 34 an orientating-accelerating electric field perpendicularly to the surfaces of the substrates 2. The electric field has a relatively low alternating frequency, for example, 1 to 100 MHz, preferably 13.6 MHz. The high-frequency power source 39 may be formed by a coil which is supplied with a high-frequency current. The high-frequency power source 39 is covered with a heating source 40 which heats the semiconductor depositing region 34 and consequently the substrates 2. The heating source 40 may be a heater which is supplied with a direct current.

To the gas inlet 32 of the reaction chamber 31 is connected one end of a mixture gas supply pipe 41, to which are connected a main semiconductor material compound gas source 47, and N type impurity compound gas source 48, a P type impurity compound gas source 49, an additional semiconductor material compound gas source 50 and a carrier gas source 51 through control valves 42, 43, 44, 45, and 46, respectively.

From the main semiconductor material compound gas source 47 is supplied a main-semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon tetrafluoride ($SiF_4$) gas or the like. From the N type impurity compound gas source 48 is supplied an N type impurity compound gas B such as an N type impurity hydride gas, an N type impurity halide gas, N type impurity hydroxide gas or the like, for example, a hydride, halide or hydroxide gas of nitrogen, phosphorus, arsenic, antimony, tellurium, selenium or the like. The N type impurity compound gas B is, for example, a phosphine ($PH_3$) gas, an arsine ($AsH_3$) gas or the like. From the P type impurity compound gas source 49 is supplied a P type impurity compound gas C such as a P type impurity hydride gas, a P type impurity hydroxide gas, a P type impurity halide gas or the like. The P type impurity compound gas C is, for example, a hydride, hydroxide or halide gas of boron, aluminum, gallium, indium, selenium or the like. For instance, a diborane ($B_2H_6$) gas is supplied from the P type impurity compound gas source 49. From the additional semiconductor material compound gas source 50 is supplied an additional semiconductor material compound gas D such as an additional semiconductor material hydroxide or halide gas of nitrogen, germanium, carbon, tin, lead or the like, for example, an $SnCl_2$, $SnCl_4$, $Sn(OH)_2$, $Sn(OH)_4$, $GeCl_4$, $CCl_4$, $NCl_3$, $PbCl_2$, $PbCl_4$, $Pb(OH)_2$, $Pb(OH)_4$ or like gas. From the carrier gas source 51 is supplied a carrier gas E which is a gas composed of or contains a Helium (He) and/or neon (Ne) gas, for example, a gas composed of the helium gas, a neon gas, or a mixer gas of the helium gas or the neon gas and a hydrogen gas.

To the gas outlet 25 of the reaction chamber 31 is connected one end of a gas outlet pipe 52, which is connected at the other end to an exhauster 54 through a control valve 53. The exhaust 54 may be a vacuum pump which evacuate the gas in the reaction chamber 31 through the control valve 53 and the gas outlet tube 52.

It is preferred that a gas homogenizer 55 is provided midway between the gas ionizing region 33 and the semiconductor depositing region 34 in the reaction chamber 31.

In the semiconductor depositing region 34 of the reaction chamber 31 there is placed on a boat 38 as of quartz the substrate 2 which has provided on the major surface thereof the conductive layer 3, as described previously in respect of FIG. 1B.

As described above, the substrate 2 is placed in the semiconductor depositing region 34 of the reaction chamber 31 and, in the state in which the gas in the reaction chamber 31 is exhausted by the exhauster 54 through the gas outlet 25, the gas outlet pipe 52 and the control valve 53, a mixture gas F containing at least the main semiconductor material compound gas A available from the main semiconductor material compound gas source 47 via the control valve 42 and the carrier gas E available from the carrier gas source 51 via the control valve 46 is introduced into the gas ionizing region of the reaction chamber 31 via the gas inlet 32. In this case, the mixture gas F may contain the N type impurity compound gas B available from the N type impurity compound gas source 48 via the control valve 43 or the P type impurity compound gas C available from the P type impurity compound gas source 49 via the control valve 44. Further, the mixture gas F may also contain the additional semiconductor material compound gas available from the additional semiconductor material compound gas source 50 via the control valve 45. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 36 to the mixture gas F introduced into the gas ionizing region 33, by which the mixture gas F is ionized into a plasma, thus forming a mixture gas plasma G in the gas ionizing region 33. In this case, the high-frequency electromagnetic field may be one that has a 10 to 300 W high-frequency energy having a frequency of 1 to 100 GHz, for example, 2.46 GHz.

Since the electromagnetic field employed for ionizing the mixture gas F into the mixture gas plasma G in the gas ionizing region 33 is a micro-wave electromagnetic field and has such a high frequency as mentioned above, the ratio of ionizing the mixture gas F into the mixture gas plasma G is high. The mixture gas plasma G contain at least a carrier gas plasma into which the carrier gas contained in the mixture gas F is ionized and a main semiconductor material compound gas plasma into which the semiconductor compound gas is ionized. Since the carrier gas contained in the mixture gas F is a gas composed of or containing the helium gas and/or the neon gas, it has a high ionizing energy. For example, the helium gas has an ionizing energy of 24.57 eV and the neon gas an ionizing energy of 21.59 eV. In contrast thereto, hydrogen and argon employed as the carrier gas in the conventional method have an ionizing energy of only 10 to 15 ev. Consequently, the carrier gas plasma contained in the mixture gas plasma has a large energy. Therefore, the carrier gas plasma promotes the ionization of the semiconductor material compound gas contained in the mixture gas F. Accordingly, the ratio of ionizing the semiconductor material compound gas contained in the mixture gas into the semiconductor material compound gas plasma is high.

Consequently, the flow rate of the semiconductor material compound gas plasma contained in the mixture gas plasma G formed in the gas ionizing region 33 is high relative to the flow rate of the entire gas in the gas ionizing region 33.

The same is true of the case where the additional semiconductor material compound gas D, the N type impurity compound gas B or P type impurity compound gas C is contained in the mixture gas F and ionized into its gas plasma.

The mixture gas plasma G thus formed is flowed into the semiconductor depositing region 34 through the gas homogenizer 55 by exhausting the gas in the reaction chamber 31 by means of the exhauster 54 through the gas outlet 25, the gas outlet pipe 52 and the control valve 53.

By flowing the mixture gas plasma G into the semiconductor depositing region 34, semiconductor material is deposited on the substate 2 placed in the semiconductor depositing region 34. In this case, the flow rate of the mixture gas F introduced into the reaction chamber 31, especially the flow rate of the carrier gas E contained in the mixture gas F is controlled beforehand by the adjustment of the control valve 46 and the flow rate of the gas exhausted from the reaction chamber 31 through the gas outlet 25 is controlled in advance by adjustment of the control valve 53, by which the atmospheric pressure in the reaction chamber 31 is held below 1 atm. Moreover, the substrate 2 is maintained at a relatively low temperature under a temperature at which semiconductor layers deposited on the substrates become crystallized, for example, in the range from the room temperature to 700° C. In the case of maintaining the substrate 2 at room temperature, the heating source 40 need not be used, but in the case of holding the substrate 2 at a temperature higher than the room temperature, the heating source 40 is used to heat the substrate 2. Furthermore, the deposition of the semiconductor material on the substrate 2 is promoted by the orientating-accelerating electric field established by the orientating-accelerating high-frequency source 39 in a direction perpendicular to the surfaces of the substrate 2.

As described above, by depositing the semiconductor material on the substate 2 in the semiconductor depositing region 34 in the state in which the atmospheric pressure in the reaction chamber 31 is held low and the substrate 2 is held at a relatively low temperature, a desired non-single crystal semiconductor 4 which is formed of a mixture of a microcrystalline semiconductor and a non-crystalline semiconductor and in which the mixture is doped with a dangling bond neutralizer is formed on the substrate 2. The non-single crystal semiconductor 4 has a two-layer structure comprising the N type layer 5 and the P type layer 6 to form therebetween a PN junction.

In this case, the mixture gas plasma in the semiconductor depositing region 34 is the mixture plasma having flowed thereinto from the gas ionizing region 33, and hence is substantially homogeneous in the semiconductor depositing region 34. Consequently, the mixture gas plasma is substantially homogeneous over the entire surface of the substrate 2.

Accordingly, it is possible to obtain on the substrate 2 the non-single crystal semiconductor 4 which is homogeneous in the direction of its surface and has substantially no or a negligibly small number of voids.

In addition, since the flow rate of the semiconductor material compound gas plasma contained in the mixture gas plasma G formed in the gas ionizing region 33 is large with respect to the flow rate of the entire gas in the gas ionizing region 33, as mentioned previously, the flow rate of the semiconductor material compound gas plasma contained in the mixture gas on the surface of the substrate 2 in the semiconductor depositing region 34 is also large relative to the flow rate of the entire gas on the surface of the substrate 2. This ensures that the non-single crystal semiconductor 4 deposited on the surface of the substrate 2 has substantially no or a negligibly small number of voids and is homogeneous in the direction of the surface of the substrate 2.

Besides, since the carrier gas plasma contained in the mixture gas plasma formed in the gas ionizing region 33 has a large ionizing energy, as referred to previously, the energy of the carrier gas plasma has a large value when and after the mixture gas plasma flows into the semiconductor depositing region 34, and consequently the energy of the semiconductor material compound gas plasma contained in the mixture plasma on the substrate 2 in the semiconductor depositing region 34 has a large value. Accordingly, the non-single crystal semiconductor 4 can be deposited on the substrate 2 with high density.

Furthermore, the carrier gas plasma contained in the mixture gas plasma is composed of or includes the helium gas plasma and/or the neon gas plasma, and hence has a high thermal conductivity. Incidentally, the helium gas plasma has a thermal conductivity of 0.123 Kcal/mHg°C. and the neon gas plasma 0.0398 Kcal/mHg°C. Accordingly, the carrier gas plasma greatly contributes to the provision of a uniform temperature distribution over the entire surface of the substrate 2. In consequence, the non-single crystal semiconductor 4 deposited on the substrate 2 can be made homogeneous in the direction of its surface.

Moreover, since the carrier gas plasma contained in the mixture gas in the semiconductor depositing region 4 is a gas plasma composed of or containing the helium gas plasma and/or the neon gas plasma, the helium gas plasma is free to move in the non-single crystal semiconductor 4 formed on the substrate 2. This reduces the density of recombination centers which tends to be formed in the non-single crystal semiconductor 4, ensuring to enhance its property.

Figure 3:
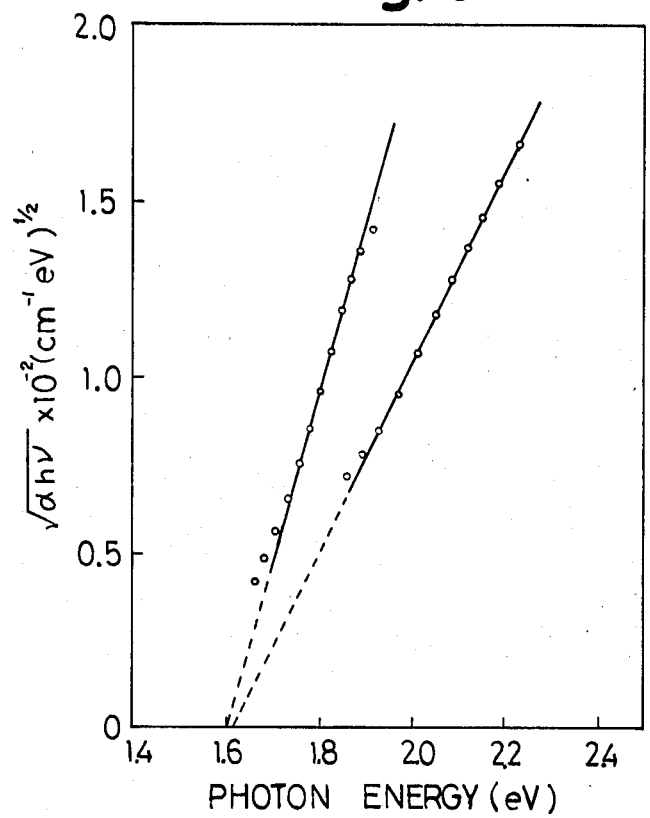
FIG. 3 is a graph showing the optical absorption edge of the non-single crystal semiconductor produced by the step of FIG. 1C.

The above has clarified an example of the method for the formation of the non-single crystal semiconductor 4 in the case where it is the semi-amorphous semiconductor. With the above-described method, the non-single crystal semiconductor 4 can be formed containing a dangling bond neutralizer in an amount of less than 5 mol% relative to the semiconductor 4. Further, the non-single crystal semiconductor 4 can be formed by a microcrystalline semiconductor of a particle size ranging from 5 to 200 Å and equipped with an appropriate lattice strain. Moreover, the non-single crystal semiconductor 4 has a dark conductivity of $1\times10^{-4}$ to $1\times10^{-6}$ S.cm$^{-1}$ and a photoconductivity of higher than $1\times10^{-3}$ S.cm$^{-1}$ under AM1 illumination. Besides, the diffusion length of the minority carriers in the non-single crystal semiconductor 4 is 0.5 to 100 μm, and the non-single crystal semiconductor 4 has an impurity ionization rate of more than 99%. In addition, the non-single crystal semiconductor 4 exhibits optical absorption coefficients of $3.5\times10^5$, $8.5\times10^4$ and $1.5\times10^4$ cm$^{-1}$ or more for lights having wavelengths of 0.4, 0.5 and 0.6 μm, respectively, and the non-single crystal semiconductor 4 has an energy band gap in the range of 1.4 to 1.7 eV. This energy band gap 1.6 eV was confirmed by an optical absorption edge which was obtained by plotting the relation between photon energy $h\nu$ (eV) (h being the Planck's constant and $\nu$ a wavelength of light) on the abscissa and $\sqrt{\alpha h\nu}$ ($\alpha$ being an optical absorption coefficient) on the ordinate, as shown in FIG. 3.

Furthermore, the non-single crystal semiconductor 4 produced by the above-described method permits direct transition of electrons at low temperatures.

Figure 4:
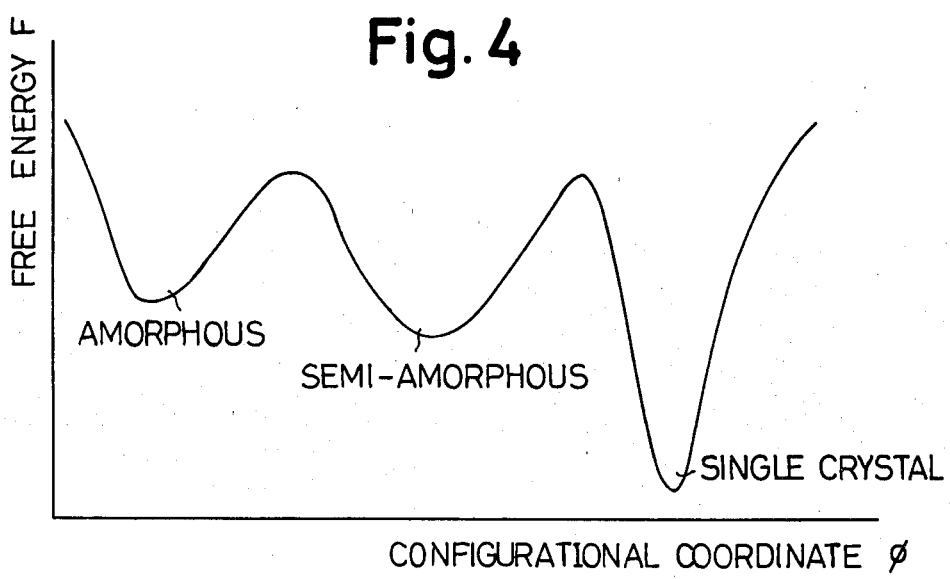
FIG. 4 is a graph showing that the non-single crystal semiconductor obtained by the step of FIG. 1C assumes a stable state as is the case with the single crystal semiconductor and the amorphous one.

And the non-single crystal semiconductor 4 assumes stable states as compared with the single crystal semiconductor and the amorphous semiconductor, as shown in FIG. 4 which shows the relationship between the configurational coordinate $\phi$ on the abscissa and the free energy F on the ordinate.

The above has clarified the manufacturing method of the present invention and its advantages in the case where the non-single crystal semiconductor 4 is the semi-amorphous semiconductor. Also in the case where the non-single crystal semiconductor 4 is an amorphous semiconductor or a mixture of the semi-amorphous semicondcutor and the amorphous semiconductor, it can be formed by the above-described method, although no description will be repeated.

Figure 1D:
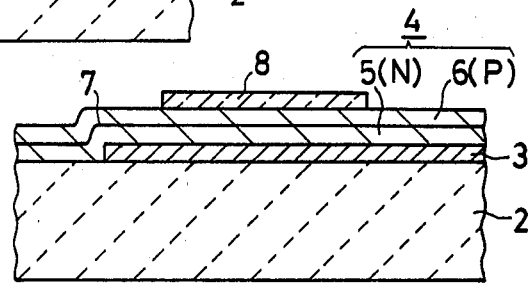

After the formation of the non-single crystal semiconductor 4 on the substrate 2, a conductive layer 8 is formed by a known method on the non-single crystal semiconductor 4 in an opposing relation to the conductive layer 3, as depicted in FIG. 1D. The conductive layer 8 is light-permeable and can be provided in the form of a film of tin oxide, indium oxide or the like.

Figure 1E:
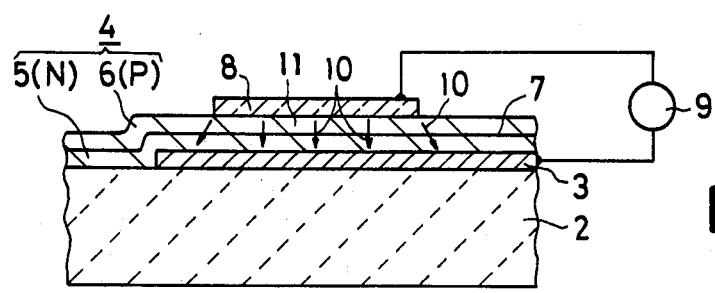
Figure 1F:
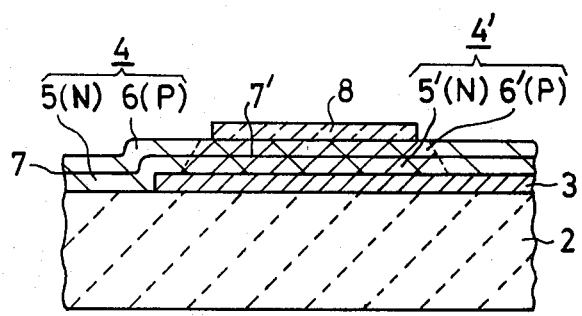
Figure 5:
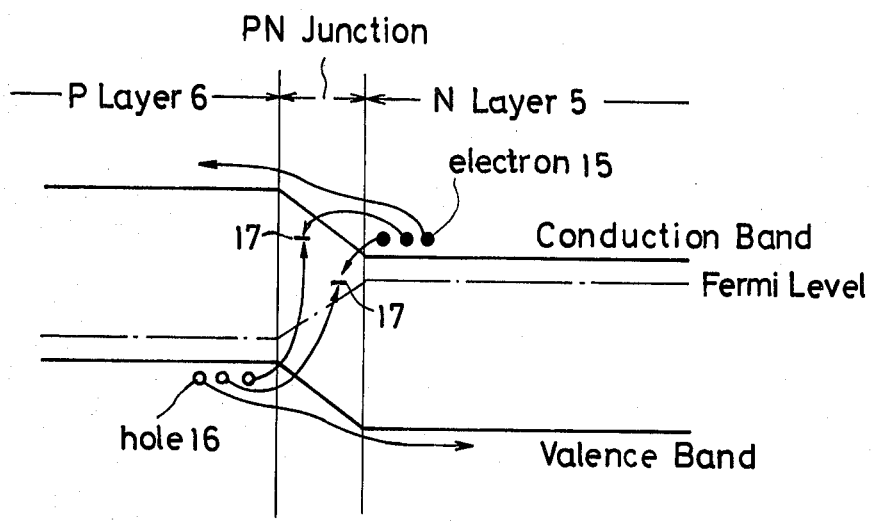
FIG. 5 shows an energy band structure explanatory of a mechanism for producing heat by a current applied to the non-single crystal semiconductor in the step of FIG. 1E.

Thereafter, as shown in FIG. 1E, a power source 9 is connected across the conductive layers 3 and 8 with such a polarity as to be forward relative to the PN junction 7 provided by the non-single crystal semiconductor 4, that is, with the conductive layer 8 made positive relative to the layer 3, and the current is applied from the power source 9 to the non-single crystal semiconductor 4 across the conductive layers 3 and 8, as indicated by arrows 10. In this case, light or/and heat are applied to the non-single crystal semiconductor 4 as will be described later in respect to FIGS. 7, 8 and 9. The current 10 flows in the non-single crystal semiconductor 4 mainly over the entire area thereof defined by the opposing conductive layers 3 and 8 and in its vicinity. The region of the non-single crystal semiconductor 4 defined by the opposing conductive layers 3 and 8 and its vicinity in which the current 10 mainly flows, will hereinafter referred to as an effective current pass region 11. In the effective current pass region 11 a semi-amorphous semiconductor 4' is formed, as depicted in FIG. 1F. The semi-amorphous semiconductor 4' has a two-layer structure comprising an N type semi-amorphous semiconductor layer 5' and a P type semi-amorphous semiconductor layer 6' and hence it provides one PN junction 7' since the non-single crystal semiconductor 4 has the two-layer structure composed of the N type and the P type layers 5 and 6 to form therebetween one PN junction 7. The mechanism by which the semi-amorphous semiconductor 4' is formed in the effective current pass region 11 is that heat is generated by the current 10 light or/and heat in the effective current pass region 11, by which it is changed in terms of structure. The reason for which heat is generated by the current 10 light or/and heat in the effective current pass region 11 is as follows: As depicted in FIG. 5 which shows an energy band structure, some of electrons 15 which flow in the conduction band of the N type non-single crystal layer 5 forming the non-single crystal semiconductor 4 and some of holes 16 which flow in the valence band of the P type non-single crystal layer 6 are combined with each other by the help of recombination centers 17 distributed in the effective current pass region 11, especially, in the PN junction 7 and in its vicinity, by which heat is generated.

In the case where the non-single crystal semiconductor 4 is formed of the semi-amorphous semiconductor (which will hereinafter be referred to as a starting semi-amorphous semicondcutor), the effective current pass region 11 is transformed by the heat generated by the current 10 light and/or heat into the semi-amorphous semiconductor 4' which contains the microcrystalline semiconductor more richly than does the starting semi-amorphous semiconductor. Even if the non-single crystal semiconductor 4 is the amorphous semiconductor or the mixture of the semi-amorphous and the amorphous semiconductor, the semi-amorphous semiconductor 4' is formed to have the same construction as in the case where the non-single crystal semiconductor 4 is the semi-amorphous one.

By the thermal energy which is yielded in the effective current pass region 11 when the semi-amorphous semiconductor 4' is formed in the effective current pass region 11, dangling bonds of the semiconductor are combined, neutralizing the dangling bonds in that region. The non-single crystal semiconductor 4 is doped with dangling bond neutralizer such as hydrogen and/or halogen. Accordingly, the dangling bond neutralizer is activated by the abovesaid thermal energy in the effective current pass region 11 and its vicinity and combined with the dangling bonds of the semiconductor. As a result of this, the semi-amorphous semiconductor 4' formed in the effective current pass region 11 has a far smaller number of recombination centers than the non-single crystal semiconductor 4.

Figure 6:
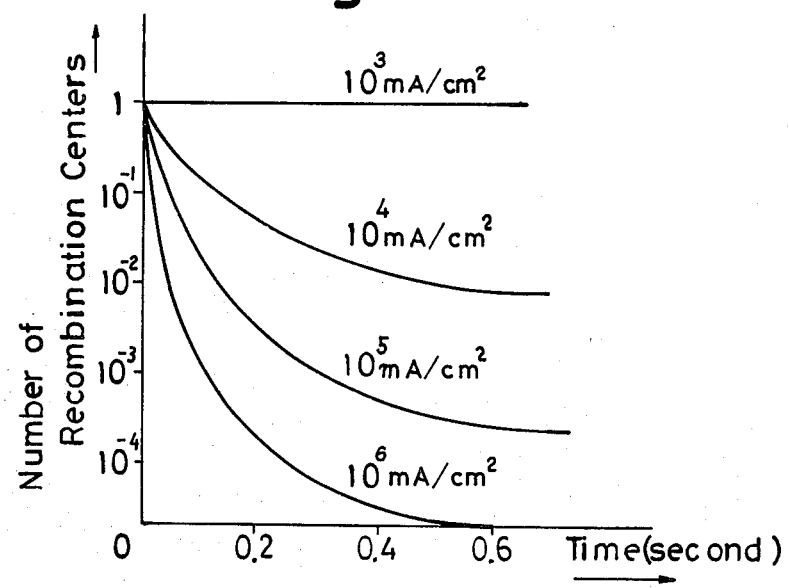
FIG. 6 is a graph showing the relationship of the number of recombination centers contained in a semi-amrophous semiconductor to the time for current supply to the non-single crystal semiconductor in the step of FIG. 1E.

The current 10 which is applied to the non-single crystal semiconductor 4 for forming the semi-amorphous semiconductor 4' in the effective current pass region 11 may be a DC current or pulse current. FIG. 6 shows the results of measurement of the number of recombination centers (cm$^{-3}$) created in the semi-amorphous semiconductor 4' with respect to the time (second) during which each of currents having densities of $10^3$, $10^4$, $10^5$ and $10^6$ mA/cm$^2$, respectively, was applied as the current 10 to the non-single crystal semiconductor 4 which was semi-amorphous silicon. The measurement was performed maintaining the substrate 2 and consequently the non-single crystal semiconductor 4 at room temperature. In FIG. 6, the number of recombination centers (cm$^{-3}$) before the application of the current 10 to the non-single crystal semiconductor 4 is normalized to 1. It will be appreciated from FIG. 6 that the semi-amorphos semiconductor 4' formed in the effective current pass region 11 has an extremely small number of recombination centers as compared with the non-single crystal semiconductor 4. According to my experience, the number of recombination centers in the semi-amorphous semiconductor 4' was extremely small- on the order of 1/10$^2$ to 1/10$^4$ that of the non-single crystal semiconductor 4.

Since the number of recombination centers in the semi-amorphous semiconductor 4' is markedly small as described above, the diffusion length of minority carriers lies in the desirable range of 1 to 50 $\mu$m.

The thermal energy which is produced in the effective current pass region 11 during the formation therein of the semi-amorphous semiconductor 4' contributes to the reduction of the number of recombination centers and the provision of the suitable diffusion length of minority carriers. Further, it has been found that the generation of the abovesaid heat contributes to the formation of the semi-amorphous semiconductor 4' with an interatomic distance close to that of the single crystal semiconductor although the semiconductor 4' does not have the atomic orientation of the latter. In the case where the non-single crystal semiconductor 4 was non-single crystal silicon, the semi-amorphous semiconductor 4' was formed with an interatomic distance of 2.3 Å±20% nearly equal to that 2.34 Å of single crystal silicon. Accordingly, the semi-amorphous semiconductor 4' has stable properties as semiconductor, compared with the non-single crystal semiconductor 4.

FIG. 1F illustrates a semi-amorphous semiconductor device produced by the embodiment of the manufacturing method of the present invention described in the foregoing. In the semi-amorphous semiconductor device of FIG. 1F, the semi-amorphous semiconductor 4', which is composed of the N and P type semi-amorphous semiconductor layers 5' and 6' laid one on the other to form therebetween the PN junction 7', is formed on the substrate 2 with the conductive layer 3 interposed therebetween and the conductive layer 8 is formed on the semi-amorphous semiconductor 4'. Such a construction is similar to that of a PN junction type photoelectric conversion semi-amorphous semiconductor device proposed in the past. Accordingly, by using the conductive layers 3 and 8 as electrodes and applying light to the semi-amorphous semiconductor device of FIG. 1F from the outside thereof so that the light may enter the semi-amorphous semiconductor 4' through the light-permeable conductive layer 8, it is possible to obtain the photoelectric conversion function similar to that obtainable with the conventional PN junction type photoelectric conversion semi-amorphous semiconductor device. In the semi-amorphous semiconductor 4' of the semi-amorphous semiconductor device of FIG. 1F produced by the embodiment of the manufacturing method of the present invention, however, the number of recombination centers is far smaller than in the case of an ordinary semi-amorphous semi-conductor (corresponding to the case where the non-single crystal semiconductor 4 prior to the formation of the semi-amorphous semiconductor 4' is semi-amorphous); the diffusion length of minority carriers is in the range of 1 to 50 μm; and the interatomic distance is close to that in the single crystal semiconductor. Therefore, the semi-amorphous semiconductor device of FIG. 1F has such an excellent feature that it exhibits a markedly high photoelectric conversion efficiency of 8 to 12%, as compared with that of the prior art semi-amorphous semiconductor device (corresponding to a device which has the construction of FIG. 1D and has its non-single crystal semiconductor 4 formed of semi-amorphous semiconductor).

Accordingly, the present invention has the advantage that a semi-amorphous semiconductor device exhibiting the abovesaid feature can be produced.

Figure 7:
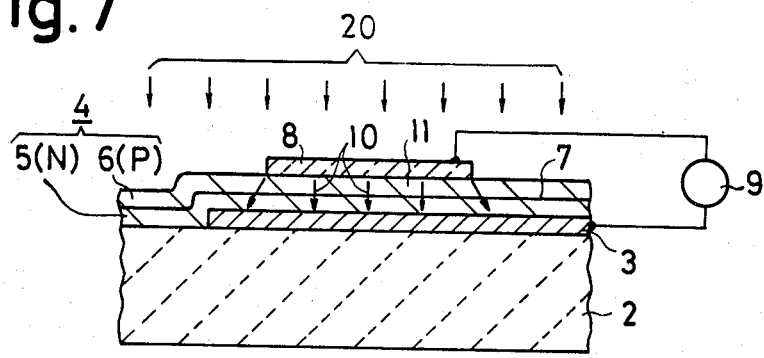
FIGS. 7, 8 and 9 are sectional views schematically showing in detail the manufacturing step depicted in FIG. 1E.

The foregoing has described the embodiment of the method for the manufacture of the semi-amorphous semiconductor device according to the present invention. FIG. 7 shows in details an example of the manufacturing method of the present invention and it differs from the above-described embodiment in that, in the step of forming the semi-amorphous semiconductor 4' in the effective current pass region 11, as shown in FIGS. 1E and 1F, by applying the current 10 to the non-single crystal semiconductor 4 across the conductive layers 3 and 8 as described previously with regard to FIG. 1E, the non-single crystal semiconductor 4 is exposed to irradiation by by light 20 from the side of the light-permeable conductive layer 8, as depicted in FIG. 7 corresponding to FIG. 1E. By the application of light 20, electron-hole pairs are created in the non-single crystal semiconductor 4 to increase its conductivity. Accordingly, the irradiation by light 20 during the application of the current 10 to the non-single crystal semiconductor 4 facilitates a sufficient supply of the current 10 to the effective current pass region 11 even if the non-single crystal semiconductor 4 has a low degree of conductivity or conductivity close to intrinsic conductivity. This permits the formation of the semi-amorphous semiconductor 4' of good quality. For the irradiation of the non-single crystal semiconductor 4, a xenon lamp, fluorescent lamp and sunlight, can be employed. According to my experiments, good results were obtained by the employment of a $10^3$-lux xenon lamp.

Figure 8:
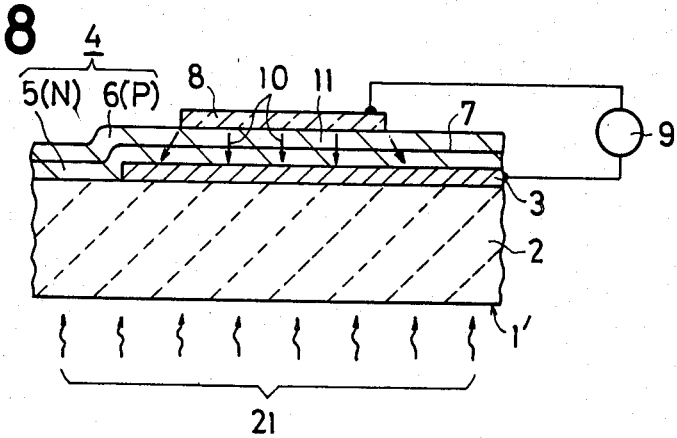

FIG. 8 shows in detail another example of the manufacturing method of the present invention, in which heat 21 is applied to the non-single crystal semiconductor 4, for example, from the side of the substrate 2, as depicted in FIG. 8 corresponding to FIG. 1E, in the course of applying the current 10 to the non-single crystal semiconductor 4 in the embodiment of the present invention described previously in respect of FIGS. 1A to 1F. This heating supplements the thermal energy which is produced by the current 10 in the effective current pass region 11 as described previously. Accordingly, the heating assures the foremation of the semi-amorphous semiconductor 4' of good quality even if the density of the current 10 is lower than that in the absence of the abovesaid heating. In my experiments, when the substrate 2 was heated up to 200° C., the relationship between the number of recombination centers and the time during which to apply the current 10 with the density of $10^5$ mA/cm$^2$, referred to previously with regard to FIG. 6, was obtained with a current density of $10^4$ mA/cm$^2$. When the temperature of the substrate 2 was raised up to 300° C., the curve in the case of the $10^6$ mA/cm$^2$ current density, also mentioned previously in respect of FIG. 6, was obtained with a current density of $10^4$ mA/cm$^2$.

Figure 9:
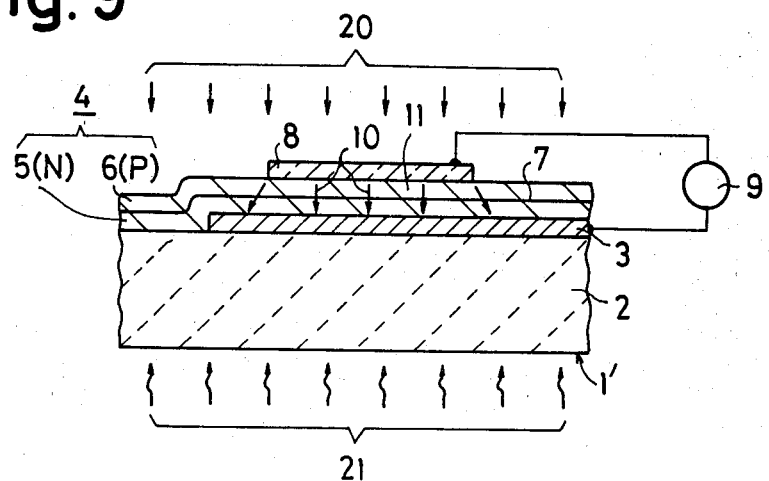

FIG. 9 shows yet another modification of the manufacturing method of the present invention, in which the non-single crystal semiconductor 4 is irradiated by light and heated concurrently with the current supply thereto. Though not described in detail, this combination of the irradiation by light and the heating produces the multiplication of the individual effects set forth in connection with FIGS. 7 and 8, respectively.

While in the foregoing the present invention has been described as being applied to the fabrication of the semi-amorphous semiconductor device in which the semi-amorphous semiconductor has the two-layer structure composed of the N type and P type semi-amorphous semiconductor layers 5' and 6' to provide therebetween one PN junction 7', that is, the semi-amorphous semiconductor device in which the semi-amorphous semiconductor has the PN junction structure, the invention is equally applicable to the manufacture of a semi-amorphous semiconductor device of the type that the semi-amorphous semiconductor has a PIN, PNPN, NI or PI junction structure.

FIGS. 10A to 10F illustrate in side elevation another embodiment of the present invention as being applied to the manufacture of a semi-amorphous semiconductor device of the type in which the semi-amorphous semiconductor has the PIN junction structure.

Figure 10A:
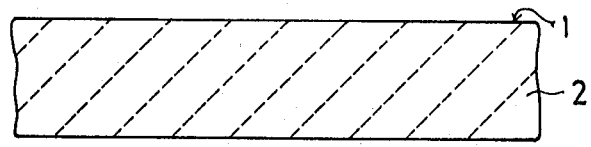
FIGS. 10A to 10F are schematic sectional views showing a sequence of steps involved in the manufacture of a semi-amorphous semiconductor in accordance with another embodiment of the present invention.
Figure 10B:
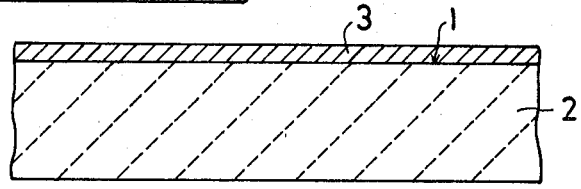
Figure 10C:
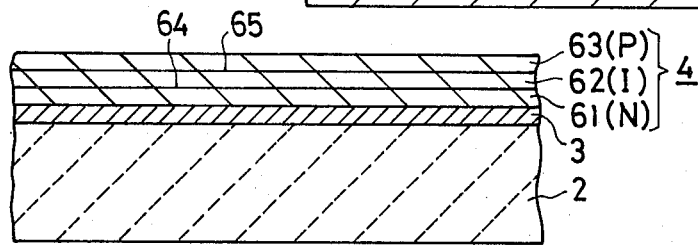
Figure 10D:
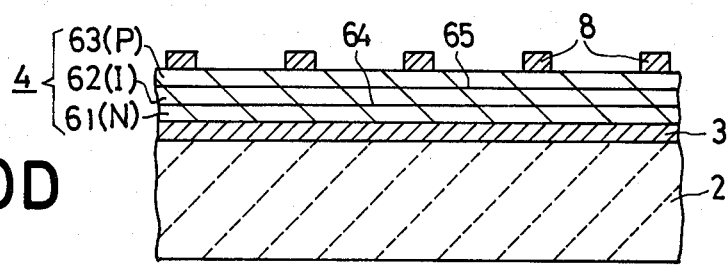
Figure 10E:
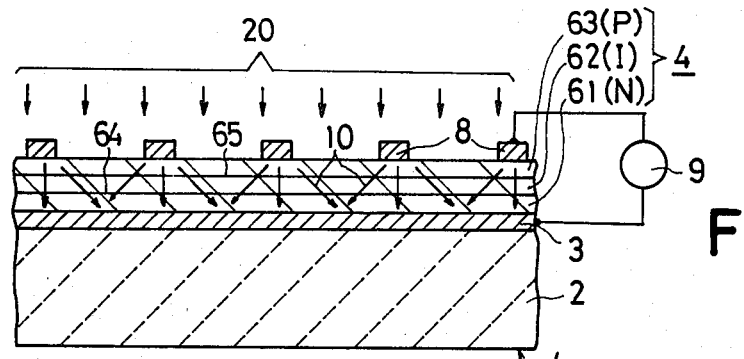
Figure 10F:
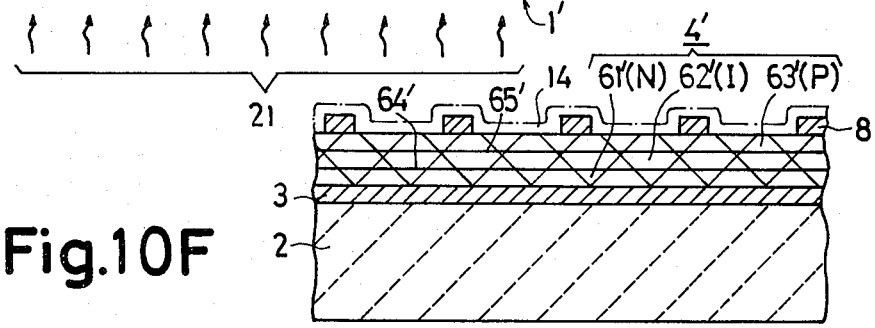

In FIGS. 10A to 10F, the parts corresponding to those in FIGS. 1A to 1F are identified by the same reference numerals. This embodiment, though not described in detail, is identical with the embodiment of FIG. 1 except the following points: In this embodiment the conductive layer 3 is formed over the entire area of the major surface 1 of the substrate 2 and the conductive layer 8 is not light-permeable and has a comb-shaped pattern. The non-single crystal semiconductor 4 is composed of N type, I type and P type non-single crystal semiconductor layers 61, 62 and 63 formed in this order to provide an NI junction 64 between the N type and I type layers 61 and 62 and a PI junction 65 between the I type and P type layers 62 and 63; accordingly, the non-single crystal semiconductor 4 has a PIN junction structure as a whole. Consequently, the semi-amorphous semiconductor 4' is comprised of N type, I type and P type semi-amorphous semiconductor layers 61', 62' and 63' sequentially laid one on another in this order to form an NI junction 64' between the N type and I type layers 61' and 62' and a PI junction 65' between the I type and P type layers 62' and 63'; accordingly, the semi-amorphous semiconductor 4' also has a PIN junction structure as a whole. In this embodiment, however, since the current 10 passes through the entire area of the non-single crystal semiconductor 4 in the step of FIG. 10E, reference numeral 11 indicating the effective current pass region is omitted. In this embodiment, the step of FIG. 10E is shown to include the irradiation of the non-single crystal semiconductor 4 and its heating but either one or both of them may be omitted. Further, in the step of FIG. 10F a combination anti-reflection and protection film 14 is provided on the semi-amorphous semiconductor 4' by molding thereon the comb-like conductive layer 8.

The manufacturing method described above in connection with FIGS. 10A to 10F is identical with the method of FIGS. 1A to 1F except the abovementioned points, and hence it has the same advantages as referred to previously with respect to FIGS. 1A to 1F.

FIGS. 11A to 11F shows in side elevation another embodiment of the manufacturing method of the present invention as being applied to a semi-amorphous semiconductor device in which the semi-amorphous semiconductor has the NI junction structure.

In FIGS. 11A to 11F, the parts corresponding to those in FIGS. 10A to 10F are marked with the same reference numerals and no detailed description will be repeated. This embodiment is identical with the embodiment of FIG. 10 except the following points: the conductive layer 3 is omitted but the substrate 2 is formed of a conductive material such as stainless steel. In the step of FIG. 11B, an insulating or semi-insulating film 15 the thickness of which is small enough to permit the passage therethrough of current is formed on the non-single crystal semiconductor 4 and the comb-like conductive layer 8 is made of a P type metal such as platinum. Moreover, the non-single crystal semiconductor 4 is composed of N type and I type non-single crystal semiconductor layers 67 and 68 laid one on the other in this order to provide therebetween an NI junction 69; accordingly, the non-single crystal semiconductor 4 has the NI structure as a whole. Consequently, the semi-amorphous semiconductor 4' is comprised of N type and I type semi-amorphous semiconductor layers 67' and 68' formed one on the other in this order to define therebetween an NI junction 69', and hence the semi-amorphous semiconductor 4' has the NI junction structure as a whole.

Since the above-described manufacturing method of FIG. 11 is identical with the method of FIG. 10 except the above-mentioned points and since the semi-amorphous semiconductor device has the PIN junction structure including the conductive layer 8 and the semi-amorphous semiconductor 4' as a whole, the method of FIG. 11 possesses the same advantages as the method of FIG. 10.

FIGS. 12A to 12E illustrate another embodiment of the present invention as being applied to the manufacture of a semi-amorphous semiconductor device in which the semi-amorphous semiconductor has the PI junction structure.

In FIGS. 12A to 12E, the parts corresponding to those in FIGS. 10A to 10F are identified by the same reference numerals and no detailed description will be repeated. This embodiment is also identical with the embodiment of FIG. 10 except the following points: The substrate 2 is formed of an N type amorphous or polycrystalline semiconductor and hence it is conductive; accordingly, the conductive layer 3 is left out. The non-single crystal semiconductor 4 comprises I type and P type non-single crystal semiconductor layers 71 and 72 formed in this order to define therebetween a PI junction 73; accordingly, the non-single crystal semiconductor 4 has the PI junction structure as a whole. Consequently, the semi-amorphous semiconductor 4' is composed of I type and P type semi-amorphous semiconductor layers 71' and 72' provided in this order to form therebetween a PI junction 73'; accordingly, the semi-amorphous semiconductor 4' has the PI junction as a whole.

Figure 12:
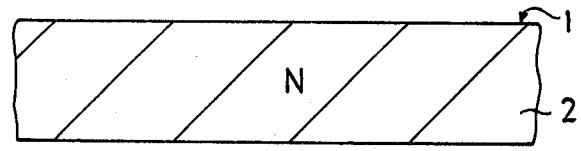
Figure 12:
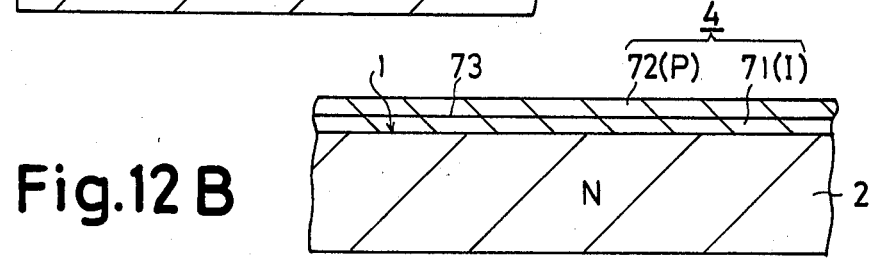
Figure 12:
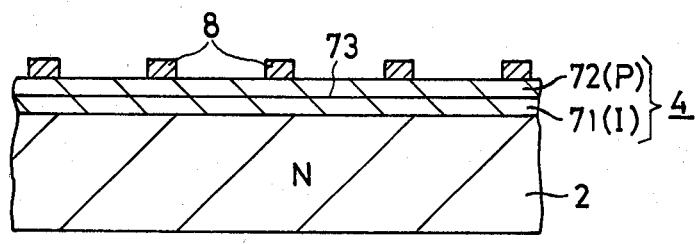
Figure 12:
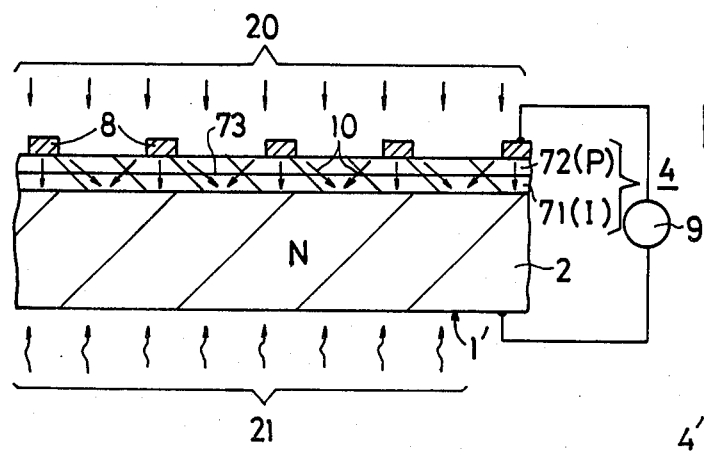
Figure 12:
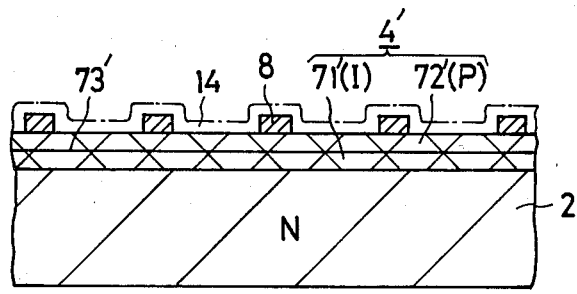
Figure 13:
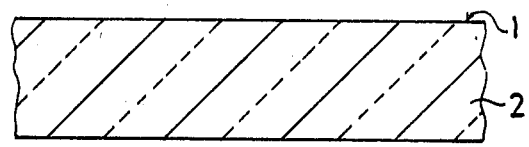
Figure 13B:
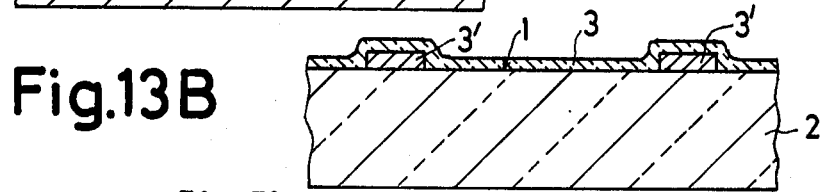
Figure 13C:
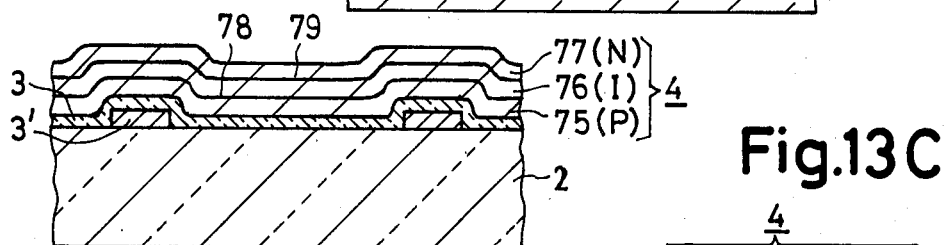
Figure 13D:
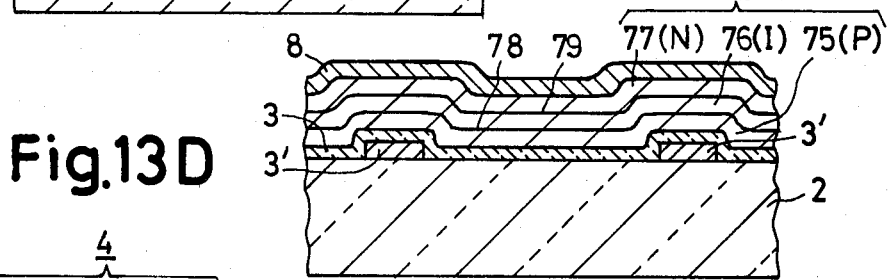
Figure 13E:
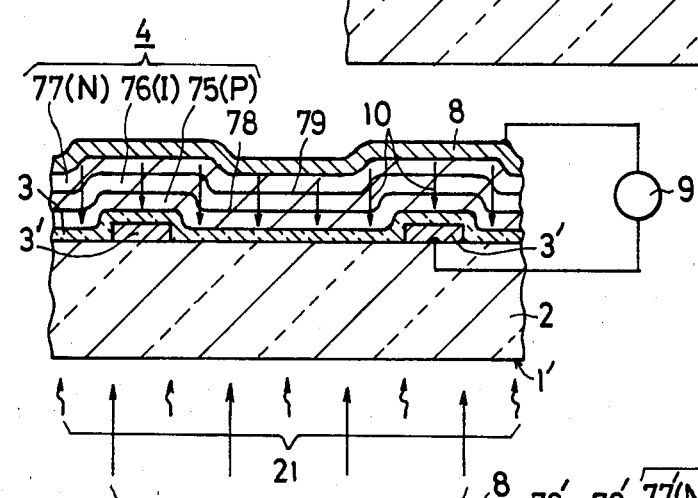
Figure 13F:
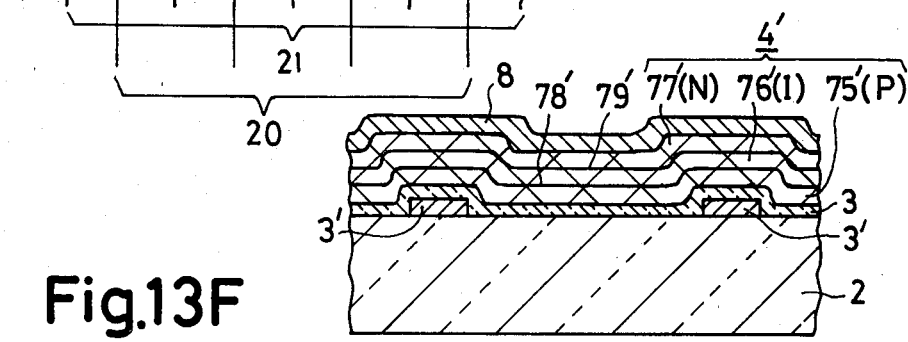
Figure 14A:
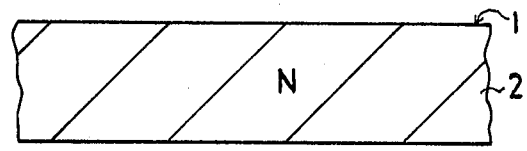
Figure 14B:
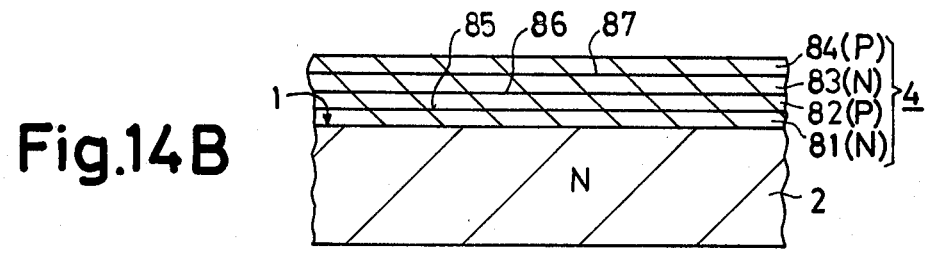
Figure 14C:
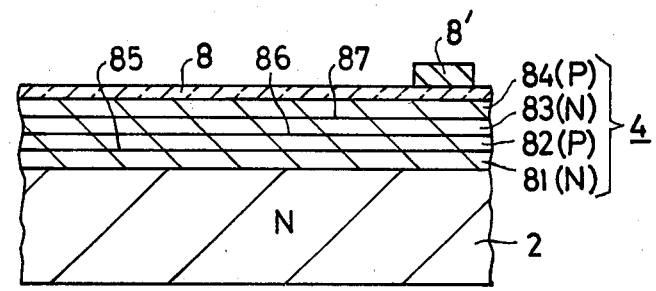
Figure 14D:
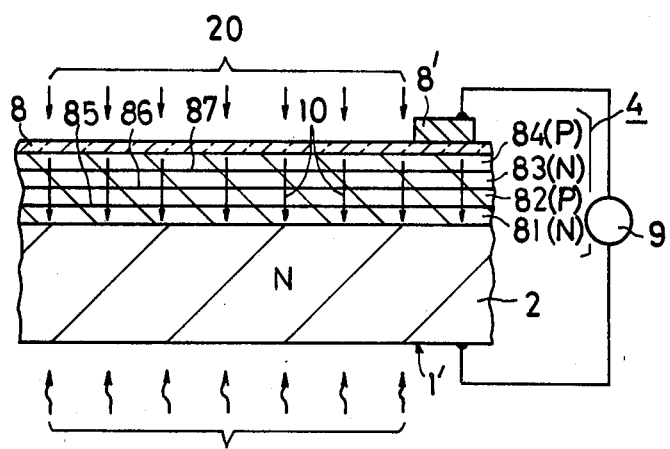
Figure 14E:
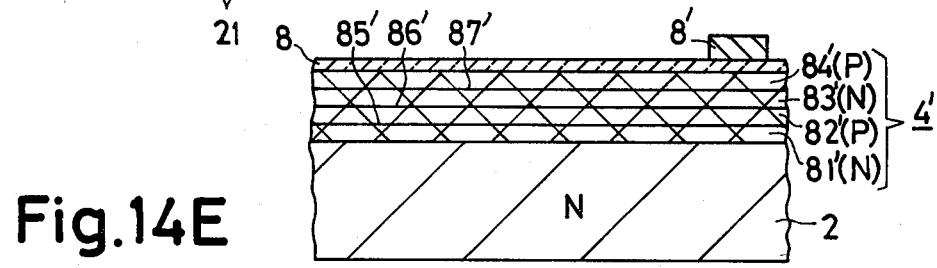
Figure 15A:
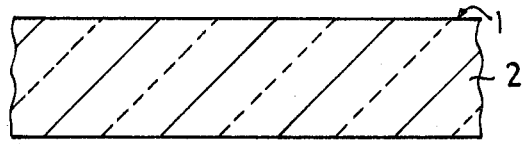
Figure 15B:
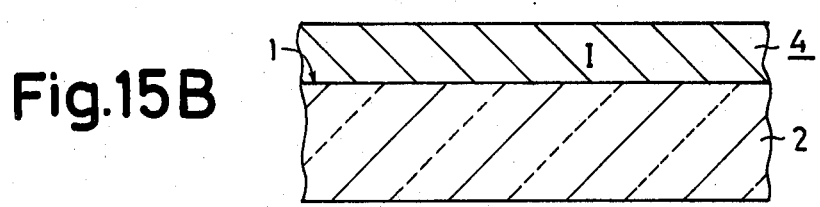
Figure 15C:
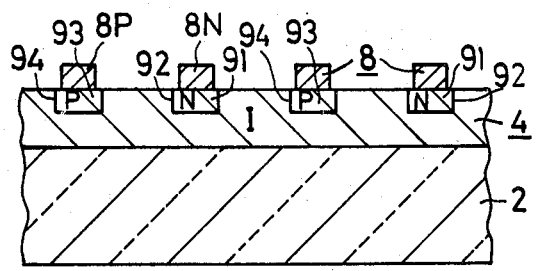
Figure 15D:
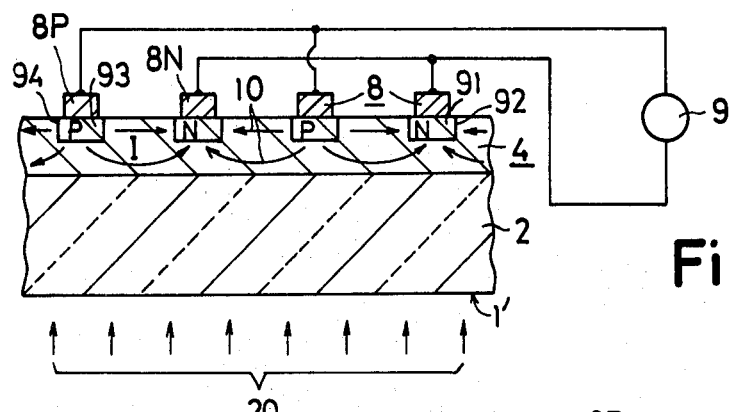
Figure 15E:
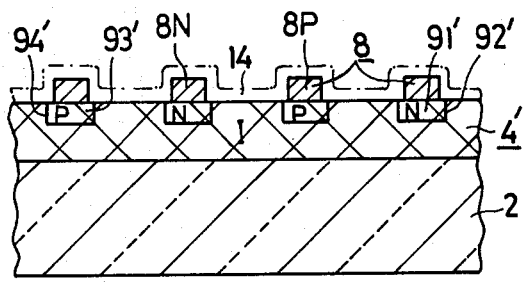

Since the manufacturing method of FIG. 12 is identical with the method of FIG. 10 except the above-described points, and since the semi-amorphous semiconductor device has the PIN junction structure including the substrate 2 and the semi-amorphous semiconductor 4 as a whole, the former exhibits the advantages as the latter.

FIGS. 13A to 13F illustrates in side elevation another embodiment of the present invention as being applied to the manufacture of a semi-amorphous semiconductor device in which the semi-amorphous semiconductor has the PIN junction structure.

In FIGS. 13A to 13F, the parts corresponding to those in FIGS. 10A to 10F are identified by the same reference numerals and no detailed description will be repeated. This embodiment is also identical with the embodiment of FIGS. 10A to 10F except the following points: The substrate 2 is formed of a light-permeable material such as glass and the conductive layer 3 is formed on another conductive layer 3' for electrically leading out the conductive layer 3 to the outside and the conductive layer 8 is not comb-shaped but planar. The non-single crystal semiconductor 4 comprises P type, I type and N type non-single crystal semiconductor layers 75, 76 and 77 formed in this order to provide a PI junction 78 between the layers 75 and 76 and an NI junction 79 between the layers 76 and 77; accordingly, the non-single crystal semiconductor 4 has the PIN junction structure as a whole. Consequently, the semi-amorphous semiconductor 4' is composed of P type, I type and N type semi-amorphous semiconductor layers 75', 76' and 77' sequentially formed in this order to define a PI junction between the layers 75' and 76' and an NI junction between the layers 76' and 77'; accordingly, the semi-amorphous semiconductor 4' has the PIN junction structure as a whole. In addition, the combination anti-reflection and protection film 14 is omitted. In this embodiment, the non-single crystal semiconductor 4 is irradiated by light through the substrate 2 in the step of FIG. 13E for the current supply to the effective current pass region 11.

This embodiment is identical with the embodiment of FIG. 10 except the above-described points, and hence the former possesses the same advantages as the latter, though not described in detail. When the semi-amorphous semiconductor device produced by this embodiment is used as a photoelectric conversion semiconductor device, light is incident thereto from the side of the substrate 2.

FIGS. 14A to 14E illustrate in side elevation another embodiment of the present invention as being applied to the manufacture of a semi-amorphous semiconductor device of the type having the PNPN junction structure.

In FIGS. 14A to 14E, the parts corresponding to those in FIGS. 10A to 10F are identified by the same reference numerals and no detailed description will be repeated. This embodiment is identical with the embodiment of FIG. 10 except the following points: The substrate 2 is formed of an N type amorphous or polycrystalline semiconductor, and hence it is conductive and the conductive layer 3 is omitted. The conductive layer 8 is not comb-shaped but planar and light-permeable, and a conductive layer 8' for electrically leading out the conductive layer 8 to the outside is provided on the layer 8. The non-single crystal semiconductor 4 is composed of N type, P type, N type and P type non-single crystal semiconductor layers 81, 82, 83 and 84 sequentially formed in this order to define PN junctions 85, 86 and 87 between the layers 81 and 82, between the layers 82 and 83 and between the layers 83 and 84, respectively; accordingly, the non-single crystal semiconductor 4 has the PNPN junction structure as a whole. Consequently, the semi-amorphous semiconductor 4' is comprised of N type, P type, N type and P type semi-amorphous semiconductor layers 81', 82', 83' and 84' sequentially formed in this order to define PN junctions 85', 86' and 87' between the layers 81' and 82', between the layers 82' and 83' and between the layers 83' and 84', respectively; accordingly, the semi-amorphous semiconductor 4' has the PNPN junction structure as a whole. Further, the combination anti-reflection and protection film 14 is omitted.

This embodiment is identical with the embodiment of FIG. 10 except the above-described points, and hence the former has the same advantages as the latter, though not described in detail.

While in the foregoing the present invention has been described as being applied to the fabrication of vertical semi-amorphous semiconductor devices of the type that current flows across the semi-amorphous semiconductor in the direction of its thickness, the invention is equally applicable to the manufacture of a lateral semi-amorphous semiconductor device of the type that current flows in the semi-amorphous semiconductor along the surface thereof.

FIGS. 15A to 15E illustrate in side elevation another embodiment of the present invention as being applied to the production of a semi-amorphous semiconductor device which is lateral and has the PIN junction structure.

In FIGS. 15A to 15E, the parts corresponding to those in FIGS. 10A to 10F are identified by the same reference numerals. This embodiment is identical with the embodiment of FIG. 10 except the following points: The conductive layer 3 is omitted and the non-single crystal semiconductor 4 is formed by one I type non-single crystal semiconductor layer. The conductive layer 8 is composed of strip-like, N type and P type electrodes 8N and 8P provided on the non-single crystal semiconductor layer 4. In the step of providing the abovesaid N type and P type electrodes 8N and 8P on the non-single crystal semiconductor layer 4 formed by the I type non-single crystal semiconductor layer, N type and P type impurities are diffused from the N type and P type electrodes 8N and 8P into the non-single crystal semiconductor 4 to form therein N type and P type regions 91 and 93, defining an NI junction and a PI junction between the N type and P type regions 91 and 93 and the I type non-single crystal semiconductor layer, respectively. Accordingly, the semi-amorphous semiconductor device has the PIN junction structure in the lateral direction as a whole. And the current 10 is applied to the non-single crystal semiconductor 4 through the electrodes 8N and 8P.

This embodiment is also identical with the embodiment of FIG. 10 except the above-described points, and hence the former possesses the same advantages as the latter, though not described in detail.

The foregoing embodiments have been described in connection with the case where the conductive layer 8, through which the current 10 is applied to the non-single crystal semiconductor 4 for the formation of the semi-amorphous semiconductor 4', is employed as an electrode of the semi-amorphous semiconductor device ultimately obtained. It is also possible, however, to eliminate the necessity of forming the conductive layer 8 so that it may be employed as an electrode of the semi-amorphous semiconductor device ultimately obtained.

Figure 16A:
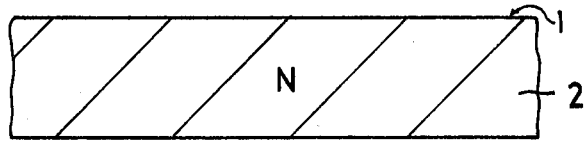
FIGS. 16A to 16F illustrate still another embodiment of the manufacturing method of the present invention.
Figure 16B:
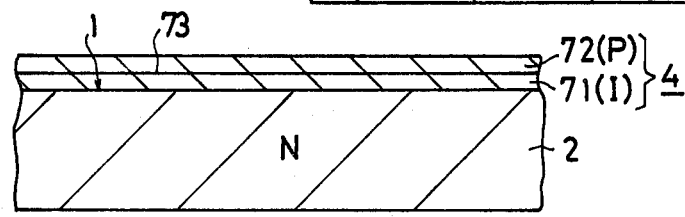
Figure 16C:
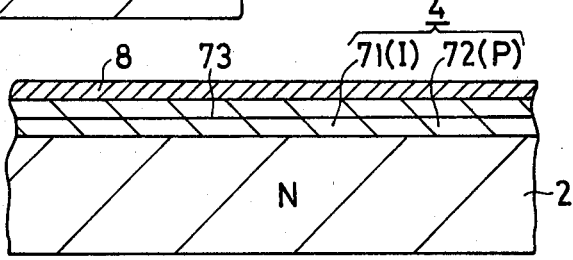
Figure 16D:
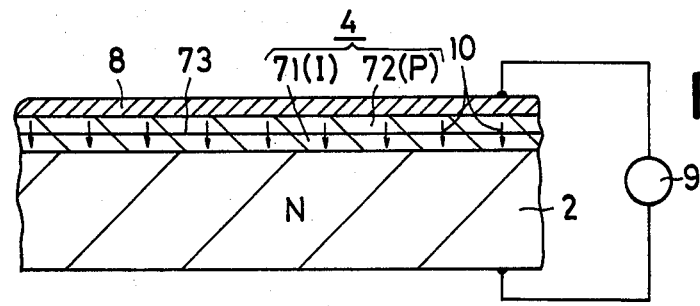
Figure 16E:
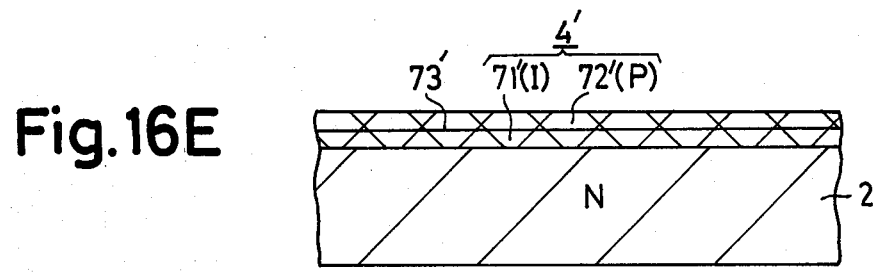
Figure 16F:
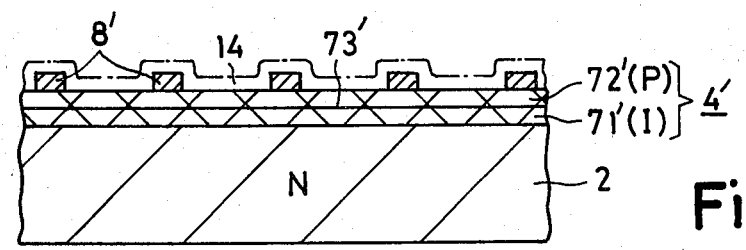

FIGS. 16A to 16F shows in side elevation another embodiment of the present invention as being applied to such a case. In FIGS. 16A to 16F, the parts corresponding to those in FIGS. 12A to 12E are identified by the same reference numerals and no detailed description will be repeated. This embodiment is the same as the embodiment of FIG. 12 except the following points: The conductive layer 8 is provided not in a comb-like shape but in a planar form. After the current 10 is applied to the non-single crystal semiconductor 4 through the conductive layer 8 to form the semi-amorphous semiconductor 4', the conductive layer 8 is removed (FIG. 16E). Then, a comb-shaped electrode 8' is newly formed on the semi-amorphous semiconductor 4', after which the combination anti-reflection and protection layer 14 is formed (FIG. 16F).

This embodiment is identical with the embodiment of FIG. 12 except the above-described points, and hence the former possesses the same advantages as the latter, though not described in detail.

The foregoing description should be construed as being merely illustrative of the present invention and various modifications and variations may be effected without departing from the scope of the novel concepts of this invention.

What is claimed is:
1. A method for the manufacture of a semi-amorphous semiconductor device, comprising the step of:
preparing a substrate;

forming on the substrate a layer of non-single crystal semiconductor doped with a dangling bond neutralizer;

forming at least one conductive layer on the non-single crystal semiconductor; and applying current to the non-single crystal semiconductor through the conductive layer and, at the same time, applying light to the non-single crystal semiconductor, thereby making semi-amorphous a region through which the current passes effectively.

2. A manufacturing method according to claim 1, wherein the substrate is conductive and light-permeable; the current is applied to the non-single crystal semiconductor through the conductive light-permeable, substrate and the conductive layer formed on the non-single crystal semiconductor; and the light is applied to the non-single crystal semiconductor through the conductive, light-permeable substrate.

3. A manufacturing method according to claim 1, wherein the substrate is conductive; the conductive layer is light-permeable; the current is applied to the non-single crystal semiconductor through the conductive substrate and the conductive layer formed on the non-single crystal semiconductor; and the light is applied to the non-single crystal semiconductor through the light-permeable conductive layer.

4. A manufacturing method according to claim 1 wherein a conductive layer is formed on the substrate prior to the formation of the non-single crystal semiconductor on the substrate; the substrate and the conductive layer formed on the substrate are light-permeable; the current is applied to the non-single crystal semiconductor through the light-permeable conductive layer formed on the substrate and the conductive layer formed on the non-single crystal semiconductor layer; and the light is applied to the non-single crystal semiconductor through the light-permeable substrate and the light-permeable conductor layer.

5. A manufacturing method according to claim 1 wherein a conductive layer is formed on the substrate prior to the formation of the non-single crystal semiconductor on the substrate; the conductive layer formed on the non-single crystal semiconductor is light-permeable; the current is applied to the non-single crystal semiconductor through the conductive layer formed on the substrate and the conductive layer formed on the non-single crystal semiconductor layer; and the light is applied to the non-single crystal semiconductor through the light-permeable, conductive layer.

6. A manufacturing method according to claim 1 wherein when the conductive layer is formed on the non-single crystal semiconductor, at least two conductive layers are formed on the non-single crystal semiconductor; the substrate is light-permeable; the current is applied to the non-single crystal semiconductor through the two conductive layers; and the light is applied to the non-single crystal semiconductor through the light-permeable substrate.

7. A manufacturing method according to claim 1 wherein when the conductive layer is formed on the non-single crystal semiconductor, at least two conductive layers are formed on the non-single crystal semiconductor; the two conductive layers are light-permeable; the current is applied to the non-single crystal semiconductor through the two light-permeable conductive layers; and the light is applied to the non-single crystal semiconductor through the two light-permeable conductive layers.

8. A manufacturing method according to claim 1 wherein the conductive layer is retained as an electrode of the semi-amorphous semiconductor device after the application of current to the non-single crystal semiconductor through the conductive layer.

9. A manufacturing method according to claim 1 wherein, after the application of current to the non-single crystal semiconductor through the conductive layer and the formation of the semi-amorphous semiconductor, the conductive layer is removed from the non-single crystal semiconductor; and at least one electrode is formed on the semi-amorphous semiconductor.

10. A manufacturing method according to claim 1 wherein when the non-single crystal semiconductor is formed on the substrate, any one of PN, PIN, PI and NI junctions is formed in the non-single crystal semiconductor.

11. A method for the manufacture of a semi-amorphous semiconductor device, comprising the steps of:
preparing a substrate;

forming on the substrate a layer of non-single crystal semiconductor doped with a dangling bond neutralizer;

forming at least one conductive layer on the non-single crystal semiconductor; and applying current to the non-single crystal semiconductor through the conductive layer and, at the same time, applying heat to the non-single crystal semiconductor, thereby making semi-amorphous a region through which the current passes effectively.

12. A manufacturing method according to claim 11, wherein the substrate is conductive; and the current is applied to the non-single crystal semiconductor through the conductive substrate and the conductive layer formed on the non-single crystal semiconductor.

13. A manufacturing method according to claim 11 wherein a conductive layer is formed on the substrate prior to the formation of the non-single crystal semiconductor on the substrate; and the current is applied to the non-single crystal semiconductor through the conductive layer formed on the substrate and the conductive layer formed on the non-single crystal semiconductor layer.

14. A manufacturing method according to claim 11 wherein when the conductive layer is formed on the non-single crystal semiconductor, at least two conductive layers are formed on the non-single crystal semiconductor; and the current is applied to the non-single crystal semiconductor through the two conductive layers.

15. A manufacturing method according to claim 11 wherein the conductive layer is retained as an electrode of the semi-amorphous semiconductor device after the application of current to the non-single crystal semiconductor through the conductive layer.

16. A manufacturing method according to claim 11 wherein, after the application of current to the non-single crystal semiconductor through the conductive layer and the formation of the semi-amorphous semiconductor, the conductive layer is removed from the non-single crystal semiconductor; and at least one electrode is formed on the semi-amorphous semiconductor.

17. A manufacturing method according to claim 11 wherein when the non-single crystal semiconductor is formed on the substrate, any one of PN, PIN, PI and NI junctions is formed in the non-single crystal semiconductor.

18. A method for the manufacture of a semi-amorphous semiconductor device, comprising the steps of:
preparing a substrate;
forming on the substrate a layer of non-single crystal semiconductor doped with a dangling bond neutralizer;
forming at least one conductive layer on the non-single crystal semiconductor; and
applying current to the non-single crystal semiconductor through the conductive layer and, at the same time, applying light and heat to the non-single crystal semiconductor, thereby making semi-amorphous a region through which the current passes effectively.

19. A manufacturing method according to claim 18, wherein the substrate is conductive and light-permeable; the current is applied to the non-single crystal semiconductor through the conductive, light-permeable substrate and the conductive layer formed on the non-single crystal semiconductor; and the light is applied to the non-single crystal semiconductor through the conductive, light-permeable substrate.

20. A manufacturing method according to claim 18, wherein the substrate is conductive; the conductive layer is light-permeable; the current is applied to the non-single crystal semiconductor through the conductive substrate and the conductive layer formed on the non-single crystal semiconductor; and the light is applied to the non-single crystal semiconductor through the light-permeable conductive layer.

21. A manufacturing method according to claim 18 wherein a conductive layer is formed on the substrate prior to the formation of the non-single crystal semiconductor on the substrate; the substrate and the conductive layer formed on the substrate are light-permeable; the current is applied to the non-single crystal semiconductor through the light-permeable conductive layer formed on the substrate and the conductive layer formed on the non-single crystal semiconductor layer; and the light is applied to the non-single crystal semiconductor through the light-permeable substrate and the light-permeable conductive layer.

22. A manufacturing method according to claim 18 wherein a conductive layer is formed on the substrate prior to the formation of the non-single semiconductor on the substrate; the conductive layer formed on the non-single crystal semiconductor is light-permeable; the current is applied to the non-single crystal semiconductor through the conductive layer formed on the substrate and the conductive layer formed on the non-single crystal semiconductor layer; and the light is applied to the non-single crystal semiconductor through the light-permeable conductive layer.

23. A manufacturing method according to claim 18 wherein when the conductive layer is formed on the non-single crystal semiconductor, at least two conductive layers are formed on the non-single crystal semiconductor; the substrate is light-permeable; the current is applied to the non-single crystal semiconductor through the two conductive layers; and the light is applied to the non-single crystal semiconductor through the light-permeable substrate.

24. A manufacturing method according to claim 18 wherein when the conductive layer is formed on the non-single crystal semiconductor, at least two conductive layers are formed on the non-single crystal semiconductor; the two conductive layers are light-permeable; the current is applied to the non-single crystal semiconductor through the two light-permeable, conductive layers; and the light is applied to the non-single crystal semiconductor through the two light-permeable conductive layers.

25. A manufacturing method according to claim 18 wherein the conductive layer is retained as an electrode of the semi-amorphous semiconductor device after the application of current to the non-single crystal semiconductor through the conductive layer.

26. A manufacturing method according to claim 18 wherein, after the application of current to the non-single crystal semiconductor through the conductive layer and the formation of the semi-amorphous semiconductor, the conductive layer is removed from the non-single crystal semiconductor; and at least one electrode is formed on the semi-amorphous semiconductor.

27. A manufacturing method according to claim 18 wherein when the non-single crystal semiconductor is formed on the substrate, any one of PN, PIN, PI and NI junctions is formed in the non-single crystal semiconductor.

28. A manufacturing method according to claim 1 wherein the non-single crystal semiconductor on the substrate is formed of silicon, germanium or an additional semiconductor material compound expressed by $Si_3N_{4-x}$ ($0<x<4$), $SiO_{2-x}$ ($0<x<2$), $SiC_x$ ($0<x<1$) or $Si_xGe_{1-x}$ ($0<x<1$).

29. A manufacturing method according to claim 1 wherein the non-single crystal semiconductor on the substrate is formed of a III-V Group compound semiconductor selected from the group consisting of GaAs, BP, or InP.

30. A manufacturing method according to claim 11 wherein the non-single crystal semiconductor on the substrate is formed of silicon, germanium or an additional semiconductor material compound expressed by $Si_3N_{4-x}$ ($0<x<4$), $SiO_{2-x}$ ($0<x<2$), $SiC_x$ ($0<x<1$) or $Si_xGe_{1-x}$ ($0<x<1$).

31. A manufacturing method according to claim 11 wherein the non-single crystal semiconductor on the substrate is formed of a III-V Group compound semiconductor selected from the group consisting of GaAs, BP, or InP.

32. A manufacturing method according to claim 18 wherein the non-single crystal semiconductor on the substrate is formed of silicon, germanium or an additional semiconductor material compound expressed by $Si_3N_{4-x}$ ($0<x<4$), $SiO_{2-x}$ ($0<x<2$), $SiC_x$ ($0<x<1$) or $Si_xGe_{1-x}$ ($0<x<1$).

33. A manufacturing method according to claim 18 wherein the non-single crystal semiconductor on the substrate is formed of a III-V Group compound semiconductor selected from the group consisting of GaAs, PB, or InP.

* * * * *